(12) United States Patent
Goller et al.

(10) Patent No.: US 7,611,958 B2
(45) Date of Patent: Nov. 3, 2009

(54) METHOD OF MAKING A SEMICONDUCTOR ELEMENT

(75) Inventors: Klaus Goller, Regensburg (DE); Tanja Schest, Moosham (DE)

(73) Assignee: Infineon Technologies AG, Neubiberg (DE)

( * ) Notice: Subject to any disclaimer, the term of this patent is extended or adjusted under 35 U.S.C. 154(b) by 138 days.

(21) Appl. No.: 11/951,015

(22) Filed: Dec. 5, 2007

(65) Prior Publication Data

US 2009/0148996 A1 Jun. 11, 2009

(51) Int. Cl.
*H01L 21/20* (2006.01)

(52) U.S. Cl. .................. 438/393; 438/386; 438/396; 438/401; 438/692; 438/756; 257/E21.008; 257/E21.009; 257/E21.012; 257/E21.021; 257/E21.274

(58) Field of Classification Search ......... 438/386–401, 438/692, 756; 257/E21.008–E21.012, E21.021, 257/E21.274
See application file for complete search history.

(56) References Cited

U.S. PATENT DOCUMENTS

| | | | | |
|---|---|---|---|---|
| 6,518,142 B2 * | 2/2003 | Yamamoto | ................. | 438/396 |
| 6,528,838 B1 * | 3/2003 | Ng et al. | ................. | 257/306 |
| 6,964,908 B2 * | 11/2005 | Hsu et al. | ................. | 438/393 |
| 7,115,467 B2 * | 10/2006 | Ajmera et al. | ................. | 438/253 |
| 2002/0081814 A1 * | 6/2002 | Ning | ................. | 438/386 |
| 2002/0155676 A1 * | 10/2002 | Stetter et al. | ................. | 438/396 |
| 2003/0001188 A1 * | 1/2003 | Nakagawa | ................. | 257/303 |
| 2004/0056324 A1 * | 3/2004 | Ning et al. | ................. | 257/528 |
| 2004/0102014 A1 * | 5/2004 | Ning et al. | ................. | 438/393 |
| 2007/0200197 A1 * | 8/2007 | Torres et al. | ................. | 257/516 |

* cited by examiner

*Primary Examiner*—Michael S Lebentritt
(74) *Attorney, Agent, or Firm*—Dicke, Billig, Czaja PLLC

(57) ABSTRACT

A method of producing a capacitor that includes producing a first electrode having a first surface; forming a recess in an element, walls of the element and the first surface of the first electrode defining the recess, the element having a first surface exterior of the recess; forming a dielectric layer on the element, the dielectric layer oriented against the first surface of the element and against the walls of the element within the recess; polishing off at least a portion of the dielectric layer oriented against the first surface of the element to electrically isolate the portion of the dielectric layer located in the recess from any portion of the dielectric layer remaining outside the recess; and producing a second electrode, the second electrode oriented at least partially within the recess with the dielectric layer oriented between the first electrode and the second electrode.

22 Claims, 3 Drawing Sheets

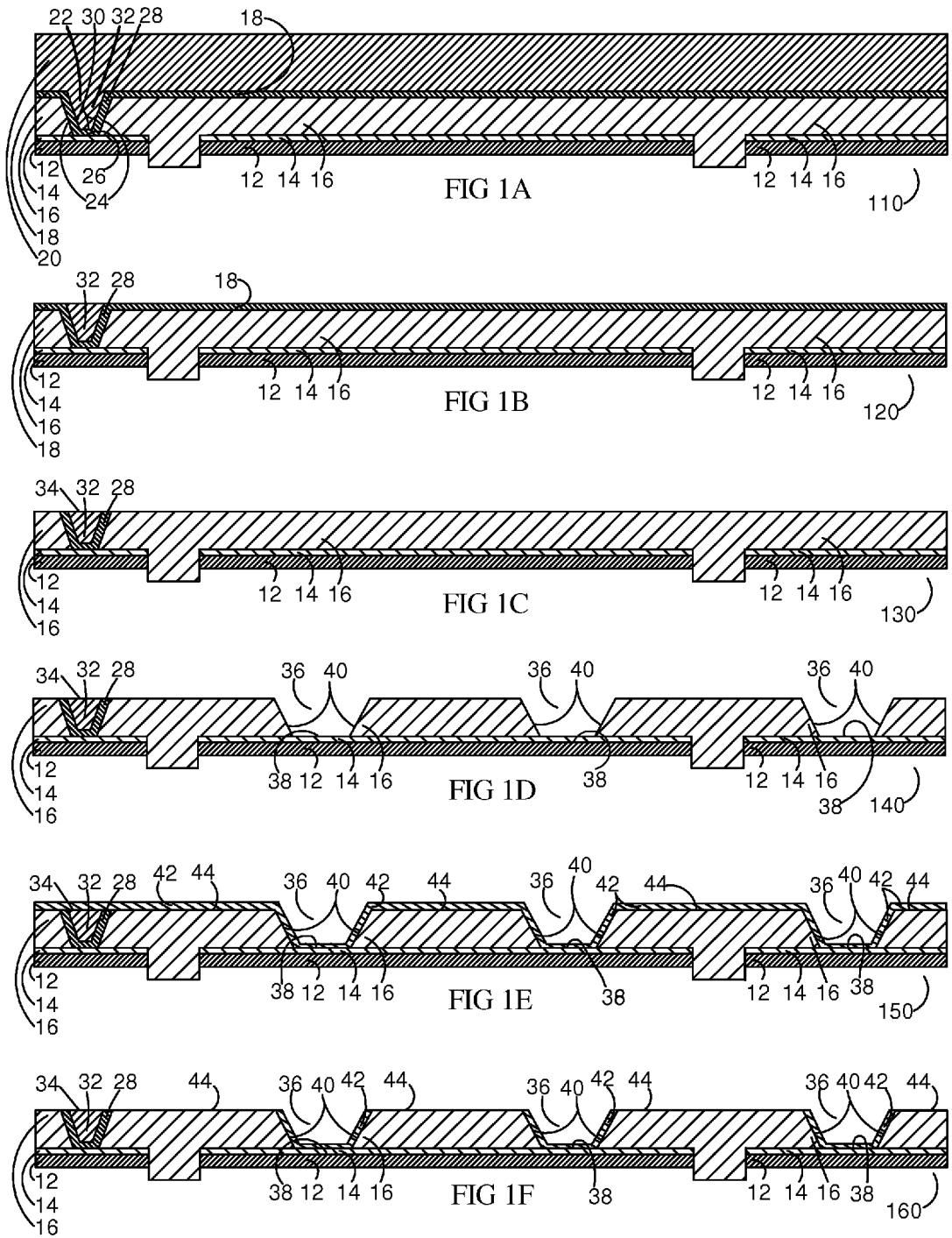

METHOD OF MAKING A SEMICONDUCTOR ELEMENT

BACKGROUND

The present invention generally relates to semiconductor elements, such as capacitors, and to methods of creating semiconductor elements. More specifically, the present invention relates to capacitors, such as metal-insulator-metal (MIM) capacitors, and to methods of creating MIM capacitors.

Capacitors are elements used extensively in electronic devices, such as in semiconductor devices, for storing an electric charge. Capacitors essentially comprise two conductive plates separated by an insulator. Capacitors are used in filters, analog-to-digital converters, memory devices, various control applications, mixed signal and analog devices, and many other types of semiconductor devices, for example.

One type of capacitor is a MIM capacitor (MIMcap). Capacitors featuring a metal-insulator-metal structure are commonly referred to as MIM capacitors. MIM capacitors are used to store a charge in a variety of semiconductor devices, such as mixed signal and analog products, for example. MIM capacitors are also used as RF capacitors in high frequency circuits. MIM capacitors are also often used in integrated circuits, as, for example, decoupling capacitors for microprocessor units (MPU's).

MIM capacitors come in various configurations. For example, both horizontally-oriented MIM capacitors (horizontal MIM capacitors) and vertically-oriented MIM capacitors (vertical MIM capacitors) are known. A horizontal MIM capacitor typically comprises a bottom conductive plate formed in a metallization layer and a top conductive plate formed in a layer overlying and in registry with the bottom conductive plate. The top conductive plate and the bottom conductive plate are separated from each other by a capacitor dielectric element.

Because most horizontal MIM capacitors have this layered structure, separate lithography and etch steps are typically employed to form the bottom conductive plate and the top conductive plate. These separate lithography and etch steps may, for example, require use of two masks, two lithography steps, and two etch steps, one each for the bottom conductive plate and the top conductive plate. Besides requiring extra resources, use of separate lithography and etch steps for formation of the bottom conductive plate and the top conductive plate also require extra measurement to ensure proper mask placement in preparation for forming the top conductive plate in registry with the bottom conductive plate. The extra measurement issue is even more pronounced when simultaneously forming the top conductive plate and vias to interconnect layers.

Existing methods for forming MIM capacitors have beneficially advanced the knowledge base regarding MIM capacitor manufacture. However, a need nevertheless remains for more efficient and cost effective MIM capacitor manufacturing processes that reduce process complexity, as compared to prior art MIM capacitor manufacturing processes. The present invention provides such a MIM capacitor manufacturing process that is more efficient and cost effective and reduces MIM capacitor manufacturing process complexity.

SUMMARY

The present invention includes a method of producing a capacitor. The method includes producing a first electrode having a first surface; forming a recess in an element where (1) walls of the element and the first surface of the first electrode define the recess and (2) the element has a first surface exterior to the recess; forming a dielectric layer on the element where the dielectric layer is oriented against the first surface of the element and against the walls of the element within the recess; polishing off at least a portion of the dielectric layer oriented against the first surface of the element to electrically isolate the portion of the dielectric layer located in the recess from any portion of the dielectric layer remaining outside the recess; and producing a second electrode where the second electrode is oriented at least partially within the recess and the dielectric layer is oriented between the first electrode and the second electrode.

BRIEF DESCRIPTION OF THE DRAWINGS

The accompanying drawings are included to provide a further understanding of the present invention and are incorporated in and constitute a part of this specification. The drawings illustrate various embodiments of the present invention and, together with the description, serve to explain the principles of the invention. Other embodiments of the present invention and many of the intended advantages of the present invention will be readily appreciated as they become better understood by reference to the following detailed description. Like reference numerals and symbols in the different drawings refer to like elements, unless otherwise indicated. The elements of the drawings are drawn to clearly illustrate relevant aspects of the disclosed embodiments, and are not necessarily drawn to scale relative to each other.

FIGS. 1A through 1F illustrate cross-sectional views of an embodiment of the present invention in various stages of fabrication in accordance with the present invention.

DETAILED DESCRIPTION

Figure 2A:
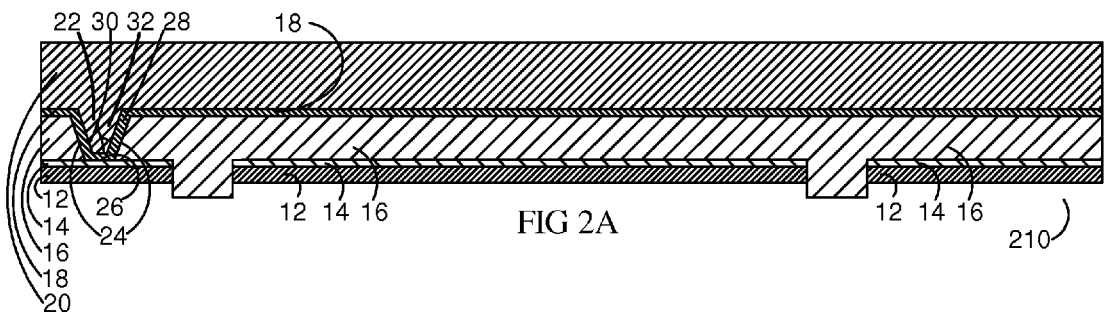
FIGS. 2A through 2E illustrate cross-sectional views of another embodiment of the present invention in various stages of fabrication in accordance with the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., may be used with reference to the orientation of the Figure(s) being described. Because components of embodiments of the present invention may be positioned in a number of different orientations, any directional terminology is used for purposes of illustration and is in no way limiting. It is to be understood other embodiments may be utilized and structural or logical changes may be made without departing from the scope of the present invention. The following detailed description, therefore, is not to be taken in a limiting sense, and the scope of the present invention is defined by the appended claims and equivalents thereof.

The term "CMP" is used herein as shorthand terminology for "chemical mechanical planarization," which is sometimes also referred to as chemical mechanical polishing or as chemical mechanical processing.

The present invention generally relates to semiconductor elements, such as capacitors, and to methods of creating semiconductor elements. More specifically, the present invention relates to capacitors, such as MIM capacitors, and to methods of creating MIM capacitors.

An intermediate of a semiconductor is depicted in cross-section at 110 in FIG. 1A. Following further processing, the intermediate 110 will be transformed into a semiconductor element that includes a MIM capacitor, more specifically a horizontal MIM capacitor. The intermediate 110 includes a first conductive element 12 that is recessed against a barrier layer 14 within an insulating layer 16. The intermediate 110 further includes a barrier layer 18 that is separated from the barrier layer 14 by the insulating layer 16. Finally, the intermediate 110 includes a conductive layer 20 oriented against the barrier layer 18 so the barrier layer 18 separates the conductive layer 20 from the insulating layer 16.

The intermediate 110 further includes a slot or hole 22 defined by walls 24 of the insulating layer 16 and an upper surface 26 of the barrier layer 14. Within the slot or hole 22, the barrier layer 18 forms a liner 28 that is secured against the walls 24 and the surface 26. Interior surfaces 30 of the liner 28 define a conductive via 32 that is oriented within the slot or hole 22. The conductive via 32 is formed of the same material used to form the conductive layer 20. In this way, the liner 28 serves as a barrier separating the insulating layer 16 from the conductive via 32. An extra conductive via 32 (or more) may be incorporated elsewhere in the intermediate 110, as desired, to support future integration of any microelectronic component derived from the intermediate 110 in a microelectronic circuit.

The intermediate 110 is subjected to CMP sufficient to remove the conductive layer 20 while leaving the barrier layer 18 planarized (topology smoothed) and in place. In this CMP procedure, the conductive via 32 and the liner 28 oriented within the slot or hole 22 (not shown in FIG. 1B) remain undisturbed, as best depicted in FIG. 1B, with the exception that any exposed portion of the via 32 is planarized. This CMP procedure transforms the intermediate 110 into an intermediate 120. The intermediate 120 is identical to the intermediate 110 with the exception that the intermediate 120 does not include the conductive layer 20.

Next, the intermediate 120 is subjected to CMP sufficient to remove the barrier layer 18 while planarizing (smoothing topology of) the insulating layer 18. In this CMP procedure, the conductive via 32 and the liner 28 oriented within the slot or hole 22 remain undisturbed, as best depicted in FIG. 1C, with the exception that an outer surface 34 of the via 32 is planarized. This CMP procedure transforms the intermediate 120 into an intermediate 130. The intermediate 130 is identical to the intermediate 120 with the exception that the intermediate 130 does not include the barrier layer 18.

Next, the insulating layer 16 within the intermediate 130 is patterned and etched with a pattern (not shown) to form conductive element pockets 36 within the insulating layer 16. The patterning and etching to form the pockets 36 may employ, for example, a conventional resist mask and any conventional plasma etching process adequate to form the pockets 36 in the material of the insulating layer 16. Alternatively, the patterning and etching to form the pockets 36 may employ, for example, a damascene process. With this configuration, the pockets 36 are defined by an upper surface 38 of the barrier layer 14 and by walls 40 of the insulating layer 16. The pockets 36 and the first conductive element 12 are oriented on opposing sides of the barrier layer 14.

The patterning and etching should generally be adequate to at least remove the material of the insulating layer 16 down to the barrier layer 14, as best depicted in FIG. 1D. The patterning and etching may permissibly thin the barrier layer 14 somewhat, so long as the barrier layer 14 remains sufficiently thick to serve as a diffusion barrier and prevent diffusion of dielectric material of dielectric layer 42 (see top of page 6 and FIGS. 1E and 1F) into contact with the first conductive element 12. Also, the patterning and etching in the course of forming the pockets 36 will desirably allow exposed portions of the barrier layer 14 to support smooth deposition of the dielectric material of dielectric layer 42.

This patterning and etching step used to form the pockets 36 transforms the intermediate 130 into an intermediate 140. The intermediate 140 is identical to the intermediate 130 with the exception that the intermediate 140 includes the pockets 36, whereas the intermediate 130 does not include the pockets 36.

Continuing, dielectric material is deposited onto exposed exterior surfaces 44 of the insulating layer 16, the upper surface 38 of the barrier layer 14 within each pocket 36, and on each wall 40 of the insulating layer 16 within each pocket 36, as best depicted in FIG. 1E, to form a dielectric layer 42. This dielectric layer 42 deposition step transforms the intermediate 140 into an intermediate 150. The intermediate 150 is identical to the intermediate 140 with the exception that the intermediate 150 includes the dielectric layer 42, whereas the intermediate 140 does not include the dielectric layer 42.

Next, the intermediate 150 is subjected to CMP sufficient to fully remove the dielectric layer 42 from exterior surfaces 44 of the insulating layer 16 located outside of the pockets 36, while leaving the dielectric layer 42 in place against the upper surface 38 of the barrier layer 14 within the pockets 36 and against the walls 40 of the insulating layer 16 within the pockets 36, as best depicted in FIG. 1F. It is important for electrical functionality of the capacitor being produced that all dielectric material of the dielectric layer 42 be removed from the outer surface 34 of the via 32.

The CMP procedure also planarizes (smoothes topology of) exterior surfaces 44 of the insulating layer 16 located outside of the pockets 36 and the outer surface 34 of the via 32. This CMP procedure transforms the intermediate 150 into an intermediate 160. The intermediate 160 is identical to the intermediate 150 with the exception that the intermediate 160 excludes the dielectric layer 42 from exterior surfaces 44 of the insulating layer 16 located outside of the pockets 36 and excludes the dielectric layer 42 from the outer surface 34 of the via 32.

Removal of the dielectric layer 42 from exterior surfaces 44 of the insulating layer 16 located outside of the pockets 36 and from the outer surface 34 of the via 32, while leaving the dielectric layer 42 in place against the barrier layer 14 and walls 40 of the insulating layer 16 may be accomplished using only CMP. No other processing beyond CMP need be undertaken to effect removal of the dielectric layer 42 from exterior surfaces 44 of the insulating layer 16 located outside of the pockets 36 and from the outer surface 34 of the via 32. While it is permissible to employ another procedure (mask placement, etching, etc.) to effect removal of the dielectric layer 42 from exterior surfaces 44 of the insulating layer 16 located outside of the pockets 36 and from the outer surface 34 of the via 32, in one embodiment, only CMP, in the absence of any other procedure (mask placement, etching, etc.), is employed to effect removal of the dielectric layer 42 from exterior surfaces 44 of the insulating layer 16 located outside of the pockets 36 and from the outer surface 34 of the via 32.

The pockets 36 of the intermediate 160 may be filled with conductive material to form conductive elements (not shown) within the pockets 36. The conductive material rests on top of, and in contact with, the dielectric layer 42 within each pocket 36. The first conductive element 12, the dielectric layer 42, and the conductive element within a particular one of the pockets 36 collectively form a MIM capacitor. Upon filling each of the pockets 36 depicted in FIG. 1F with conductive material, the intermediate 160 would include at least three separate MIM capacitors. However, the intermediate 160 may be configured in any desired fashion to include as many pockets 36 (and thus as many separate MIM capacitors) as desired for a particular application. For example, the intermediate 160 may alternatively be configured to include only one of the pockets 36 (and thus only one MIM capacitor), to include two of the pockets 36 (and thus two MIM capacitors), to include four of the pockets 36 (and thus four MIM capacitors), and etc.

Upon formation of each MIM capacitor (comprising the first conductive element 12, the dielectric layer 42, and the conductive element within a particular one of the pockets 36), appropriate contact pads and/or conductors may be added or incorporated, as will be recognized by those of ordinary skill in the art, to integrate the MIM capacitor(s) into any desired microelectronic circuit. One may also wish to utilize any conductive via(s) 32 included on the intermediate 160 (or a derivative of the intermediate 160) to help integrate the MIM capacitor(s) into any desired microelectronic circuit.

Another intermediate of a semiconductor is depicted in cross-section at 210 in FIG. 2A. The intermediate 210 is identical to the intermediate 110 depicted in FIG. 1A. Following further processing, the intermediate 210 will be transformed into a semiconductor element that includes a MIM capacitor, more specifically a horizontal MIM capacitor. The intermediate 210 includes the first conductive element 12 that is recessed against the barrier layer 14 within the insulating layer 16. The intermediate 210 further includes the barrier layer 18 that is separated from the barrier layer 14 by the insulating layer 16. Finally, the intermediate 210 includes the conductive layer 20 oriented against the barrier layer 18 so the barrier layer 18 separates the conductive layer 20 from the insulating layer 16.

The intermediate 210 further includes the slot or hole 22 defined by walls 24 of the insulating layer 16 and the upper surface 26 of the barrier layer 14. Within the slot or hole 22, the barrier layer 18 forms the liner 28 that is secured against the walls 24 and the surface 26. Interior surfaces 30 of the liner 28 define the conductive via 32 that is oriented within the slot or hole 22. The conductive via 32 is formed of the same material used to form the conductive layer 20. In this way, the liner 28 serves as a barrier separating the insulating layer 16 from the conductive via 32. One or more additional conductive via(s) 32 may be incorporated elsewhere in the intermediate 210, as desired, to support future integration of any microelectronic component derived from the intermediate 210 in a microelectronic circuit.

Figure 2B:
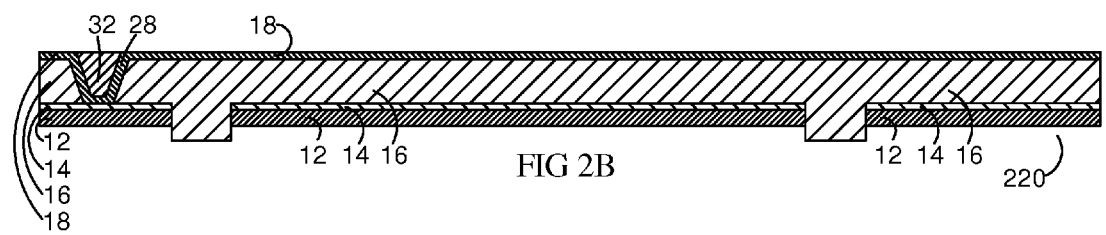

The intermediate 210 is subjected to CMP sufficient to remove the conductive layer 20 while planarizing (smoothing topology of) the barrier layer 18 and leaving the barrier layer 18 in place. In this CMP procedure, the conductive via 32 and the liner 28 oriented within the slot or hole 22 remain undisturbed, as best depicted in FIG. 2B, with the exception that any exposed portion of the via 32 is planarized. This CMP procedure transforms the intermediate 210 into an intermediate 220. The intermediate 220 is identical to the intermediate 210 with the exception that the intermediate 220 does not include the conductive layer 20. Furthermore, the intermediate 220 is identical to the intermediate 120 depicted in FIG. 1B.

Next, the barrier layer 18 and underlying insulating layer 16 within the intermediate 220 are patterned and etched with a pattern (not shown) to form the conductive element pockets 36 within the insulating layer 16. The patterning and etching to form the pockets 36 may employ, for example, a conventional resist mask and any conventional plasma etching process adequate to form the pockets in the material of the insulating layer 16. Alternatively, the patterning and etching to form the pockets 36 may employ, for example, a damascene process. Following the etching process, the pockets 36 are defined by the barrier layer 14 and by the walls 32 of the insulating layer 16. The pockets 36 and the first conductive element 12 are oriented on opposing sides of the barrier layer 14.

Figure 2C:
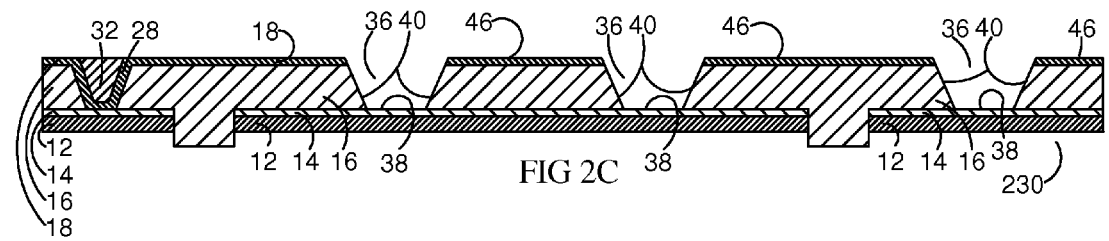

The patterning and etching should generally be adequate to remove the material of the insulating layer 16 down to the barrier layer 14, as best depicted in FIG. 2C. The patterning and etching may permissibly thin the barrier layer 14 somewhat, so long as the barrier layer 14 remains sufficiently thick to serve as a diffusion barrier and prevent diffusion of dielectric material of dielectric layer 42 (see bottom of page 9 and FIGS. 2D and 2E) into contact with the first conductive element 12. Also, the patterning and etching in the course of forming the pockets 36 will desirably allow exposed portions of the barrier layer 14 to support smooth deposition of the dielectric material of dielectric layer 42.

This patterning and etching step that creates the pockets 36 transforms the intermediate 220 into an intermediate 230. The intermediate 230 is identical to the intermediate 220 with the exception that the intermediate 230 includes the pockets 36 whereas the intermediate 220 does not include the pockets 36 and with the further exception that the barrier layer 18 is continuous in the intermediate 220 but is excluded from the intermediate 230 proximate the pockets 36.

Figure 2D:
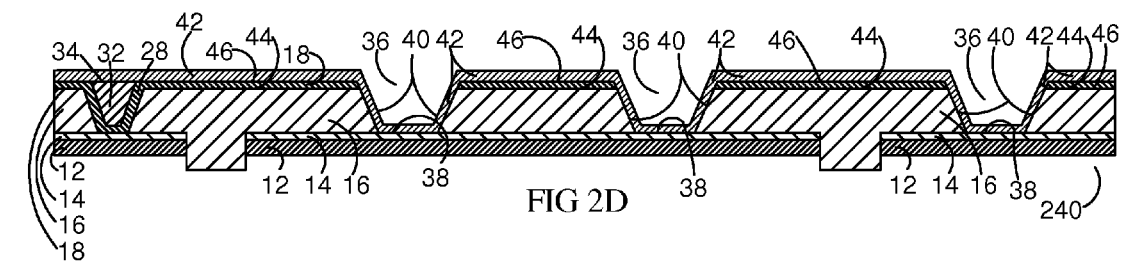
Figure 2E:
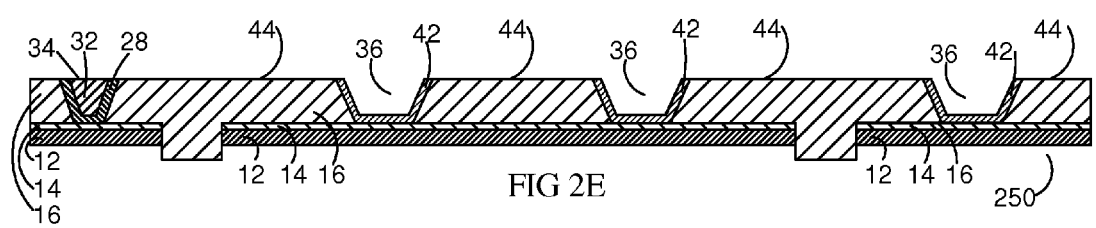

Continuing, dielectric material is deposited within the intermediate 230 onto exposed exterior surfaces 46 of the barrier layer 18, the upper surface 38 of the barrier layer 14 within each pocket 36, and on each wall 40 of the insulating layer 16 within each pocket 36, as best depicted in FIG. 2D, to form the dielectric layer 42. This leaves the pockets 36 lined with the dielectric layer 42, as best depicted in FIG. 2D. This dielectric layer 42 deposition step transforms the intermediate 230 into an intermediate 240. The intermediate 240 is identical to the intermediate 230 with the exception that the intermediate 240 includes the dielectric layer 42, whereas the intermediate 230 does not include the dielectric layer 42.

Next, the intermediate 240 is subjected to CMP sufficient to remove the dielectric layer 42 and barrier layer 18 from surfaces 44 of the insulating layer 16 located outside of the pockets 36 and from outer surface 34 of the via 32, while leaving the dielectric layer 42 in place against the barrier layer 14 and walls 40 of the insulating layer 16. It is important for the electrical functionality of the capacitor being produced that all of the dielectric layer 42 overlying the barrier layer 18 outside of the pockets 36 be removed and that all of the barrier layer 18 be removed from exterior surfaces 44 of the insulating layer 16 located outside of the pockets 36. It is also important for the electrical functionality of the capacitor being produced that all of the dielectric layer 42 overlying the via 32 be removed and that any of the barrier layer 18 in contact with the outer surface 34 of the via 32 be removed.

The CMP procedure also planarizes (smoothes topology of) surfaces 44 of the insulating layer 16 located outside of the pockets 36 and the outer surface 34 of the via 32. This CMP procedure transforms the intermediate 240 into an intermediate 250. The intermediate 250 is identical to the intermediate 240 with the exception that the intermediate 250 does not include the dielectric layer 42 outside of the pockets 36 and does not include the barrier layer 18 on surfaces 44 of the insulating layer 16 located outside of the pockets 36.

Removal of the dielectric layer 42 outside of the pockets 36 and removal of the barrier layer 18 from surfaces 44 of the insulating layer 16 located outside of the pockets 36, while leaving the dielectric layer 42 in place against the barrier layer 14 and walls 40 of the insulating layer 16, may be accomplished using only CMP. No other removal procedure beyond the CMP procedure need be undertaken to effect removal of the dielectric layer 42 outside of the pockets 36 and removal of the barrier layer 18 from surfaces 44 of the insulating layer 16 located outside of the pockets 36. While it is permissible to employ another procedure (mask placement, etching, etc.) to effect removal of the dielectric layer 42 outside of the pockets 36 and removal of the barrier layer 18 from surfaces 44 of the insulating layer 16 located outside of the pockets 36, in one embodiment, only the CMP procedure, in the absence of any other procedure (mask placement, etching, etc.), is employed to effect removal of the dielectric layer 42 outside of the pockets 36 and removal of the barrier layer 18 from surfaces 44 of the insulating layer 16 located outside of the pockets 36.

The pockets 36 of the intermediate 250 may be filled with conductive material to form conductive elements (not shown) within the pockets 36. The conductive material rests on top of and in contact with the dielectric layer 42 within each pocket 36. The first conductive element 12, the dielectric layer 42, and the conductive element within a particular one of the pockets 36 collectively form a MIM capacitor. Upon filling each of the pockets 36 depicted in FIG. 2E with conductive material, the intermediate 250 would include at least three separate MIM capacitors. However, the intermediate 250 may be configured in any desired fashion to include as many pockets 36 (and thus as many separate MIM capacitors) as desired for a particular application. For example, the intermediate 250 may alternatively be configured to include only one of the pockets 36 (and thus only one MIM capacitor), to include two of the pockets 36 (and thus two MIM capacitors), to include four of the pockets 36 (and thus four MIM capacitors), and etc.

Upon formation of each MIM capacitor (comprising the first conductive element 12, the dielectric layer 42, and the conductive element within a particular one of the pockets 36), appropriate contact pads and/or conductors may be added or incorporated, as will be recognized by those of ordinary skill in the art, to integrate the MIM capacitor(s) into any desired microelectronic circuit. One may also wish to utilize any conductive via(s) 32 included on the intermediate 250 (or a derivative of the intermediate 250) to help integrate the MIM capacitor(s) into any desired microelectronic circuit.

The first conductive element 12 may alternatively be referred to herein as a first electrode 12, and any conductive element within a particular one of the pockets 36 may alternatively be referred to herein as a second electrode. Thus, each MIM capacitor (comprising the first conductive element 12, the dielectric layer 42, and the conductive element within a particular one of the pockets 36) may alternatively be characterized as comprising the first electrode 12, the dielectric layer 42, and the second electrode (that is located within a particular one of the pockets 36).

As used herein, the term "CMP" is short for "chemical mechanical planarization," which is sometimes also referred to as chemical mechanical polishing or as chemical mechanical processing. No matter which of these terms is employed, the same general concepts apply. CMP is a process of smoothing and planing (planarizing) surfaces with a combination of chemical and mechanical forces. CMP is a hybrid of chemical etching and free abrasive polishing. Mechanical grinding alone can cause excessive surface damage, while wet etching alone typically cannot attain good planarization. Most chemical etching reactions are isotropic and etch different crystal planes with different speed. CMP simultaneously combines both some mechanical grinding effects and some chemical etching effects on the workpiece. Thus, CMP can be considered to be mechanically-enhanced chemical etching or alternatively can be considered to be chemically-enhanced mechanical polishing.

One effect of CMP is the ability to planarize surfaces of a workpiece by removing material at defined areas while also leaving material at defined areas to smooth (eliminate) topology of the workpiece surfaces. Thus, CMP provides both local and global planarity to workpiece surfaces. Definition of areas where material is removed and areas where material will be retained may be accomplished by selection of mechanical grinding attributes (rotational speed and amount of force applied), selection of chemical polishes and etchants with different selectivities toward different workpiece materials. Another effect of CMP is the ability to pattern the workpiece by virtue of selecting different materials for different portions of the workpiece coupled with use of chemical polishes and etchants with different selectivities toward different workpiece materials.

Figure 3:
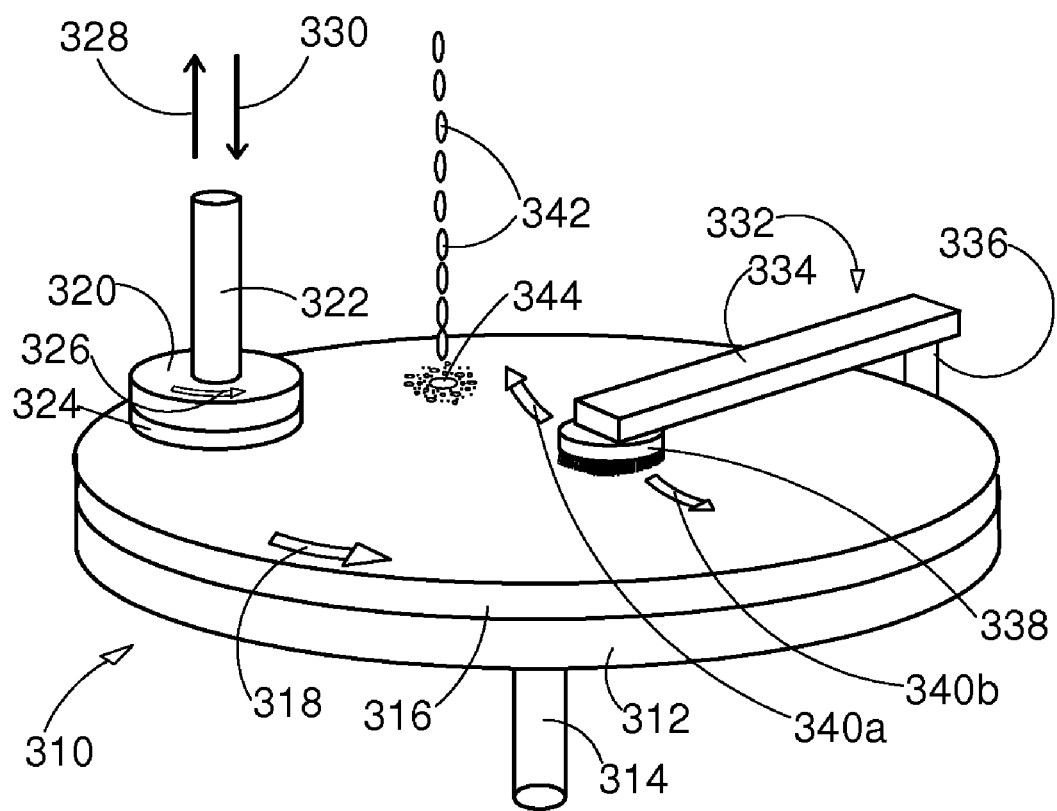
FIG. 3 is an isometric view of a CMP apparatus employed in various stages of fabrication in accordance with the present invention.

An example of a CMP apparatus employed when practicing CMP in accordance with the present invention is generally depicted at 310 in FIG. 3. The CMP apparatus 310 includes a platen or table 312 mounted on a drive mechanism 314. A polishing pad 316 is mounted on the table 312. The drive mechanism 314 supports rotational motion of the table 312 and polishing pad 316 in the direction of arrow 318.

The CMP apparatus 310 also includes a workpiece carrier, such as a wafer carrier 320, mounted on a drive mechanism 322. A workpiece, such as a microelectronic wafer 324, is held within or against the carrier 320. The drive mechanism 322 supports rotational motion of the carrier 320 and wafer 324 in the direction of arrow 326. Rotation of the carrier 320 during polishing helps achieve more uniform system kinematics and consequently better polishing uniformity. The drive mechanism 322 is selectively movable in the directions of opposing arrows 328, 330 to allow movement of the wafer 324 supported on the carrier 320 into and out of engagement with the polishing pad 316. Furthermore, the drive mechanism 322 is capable of applying varying force to the carrier 320 to support application of any desired pressure (downforce) to the wafer 324 when the wafer 324 is engaged against the polishing pad 216.

The CMP apparatus 310 also includes a pad conditioning apparatus 332. The pad conditioning apparatus 332 includes a support 334 mounted on a drive mechanism 336. A pad brush 338 is supported on the support 334. The drive mechanism 336 and the pad brush 338 or located proximate opposite ends of the support 334. The drive mechanism supports movement of the pad brush in the directions of arrows 340a, 340b, spinning of the pad brush 338, and movement of the pad brush 338 into and out of engage engagement with the polishing pad 316. The pad brush 338 helps to dislodge debris from, and clean, the polishing pad 316.

Finally, droplets 342 of a polishing liquid, typically with the consistency of a slurry, are allowed to drop into a puddle 344 on the polishing pad 316 at a predetermined rate. The polishing liquid may include any of a variety of different chemical polishes and etchants, depending upon the materials of the workpiece and the work to be done on the workpiece. In embodiments of the present invention where removal of oxide, nitride, and/or silicon layers was planned, the polishing liquid often comprised a fumed silica slurry.

CMP, such as oxide CMP, is employed in various fabrication stages when practicing the present invention. For example, CMP is employed when removing the conductive layer 20 from the intermediate 110, which yields the intermediate 120. Also, CMP is employed when removing the barrier layer 18 from the intermediate 120, which yields the intermediate 130. Furthermore, CMP is employed when removing the dielectric layer 42 from exterior surfaces 44 of the insulating layer 16 located outside of the pockets 36 in the course of converting the intermediate 150 into the intermediate 160.

Some exemplary CMP parameters employed when removing the conductive layer 20 from the intermediate 110, when removing the barrier layer 18 from the intermediate 120 and when removing the dielectric layer 42 of the intermediate 150 from exterior surfaces 44 of the insulating layer 16 located outside of the pockets 36 are provided in this paragraph. The polishing liquid was a fumed silica slurry which is an example of an oxide polishing slurry. One example of a suitable fumed silica slurry is the KLEBOSOL® 30 N50 slurry that is available from AZ Electronic Materials USA Corp. of Charlotte, N.C. USA.

Some suitable examples of the CMP apparatus 310 for conducting oxide CMP in accordance with the present invention are the AURIGA® line of CMP equipment available from SpeedFam-IPEC Corp. of Chandler, Ariz. USA which is owned by Novellus Systems, Inc. of San Jose, Calif. USA. Other exemplary sources of the CMP apparatus 310 for conducting oxide CMP in accordance with the present invention are Applied Materials, Inc, (sometimes referred to as AMAT) of Santa Clara, Calif. USA and Ebara Technologies, inc. of Sacramento, Calif. USA.

The table 312 and the carrier 320 of the CMP apparatus 310 may be operated at speeds selected in accordance with the operating manual of the particular oxide CMP apparatus obtained when processing the intermediate 110, the intermediate 120, and the intermediate 150. The polishing pad 316 used in the CMP apparatus 310 was a hard polyurethane pad. The carrier 320 carrying the workpiece (intermediate 110, then intermediate 120, then intermediate 150) was forced against the polishing pad with a force of on the order of about 365 pounds. The CMP processing lasted anywhere from about 20 to about 100 seconds per workpiece.

As some further examples, CMP is employed when removing the conductive layer 20 from the intermediate 210, which yields the intermediate 220. Also, CMP is employed when removing the dielectric layer 42 outside of the pockets 36 and when removing the barrier layer 18 of the intermediate 240 from surfaces 44 of the insulating layer 16 located outside of the pockets 36, which yields the intermediate 250.

Some exemplary CMP parameters employed when removing the conductive layer 20 from the intermediate 210 and when removing the dielectric layer 42 and barrier layer 18 of the intermediate 240 from exterior surfaces 44 of the insulating layer 16 located outside of the pockets 36 are provided in this paragraph. The polishing liquid was again a fumed silica slurry, such as the KLEBOSOL® 30 N50 slurry available from AZ Electronic Materials USA Corp. of Charlotte, N.C. USA.

Some suitable examples of the CMP apparatus 310 for conducting oxide CMP on the intermediates 210, 240 in accordance with the present invention are the AURIGA® line of CMP equipment available from SpeedFam-IPEC Corp. of Chandler, Ariz. USA which is owned by Novellus Systems, Inc. of San Jose, Calif. USA. Other exemplary sources of the CMP apparatus 310 for conducting oxide CMP in accordance with the present invention are Applied Materials, Inc, (sometimes referred to as AMAT) of Santa Clara, Calif. USA and Ebara Technologies, inc. of Sacramento, Calif. USA.

The table 312 and the carrier 320 of the CMP apparatus 310 may be operated at speeds selected in accordance with the operating manual of the particular oxide CMP apparatus obtained when processing the intermediates 210, 240. The polishing pad 316 used in the CMP apparatus 310 was a soft buffing pad. The carrier 320 carrying the workpiece (the intermediates 210, 240) was forced against the polishing pad with a force of on the order of about 1300 Newtons. The CMP processing lasted anywhere from about 20 to about 100 seconds per workpiece.

The first conductive element 12 and the conductive layer 20 may comprise a variety of electrically-conductive metals, such as aluminum, copper, tungsten, titanium, titanium nitride (i.e. TiN), and any combination(s) of any of these in any relative concentration. As additional alternatives, the first conductive element 12 and the conductive layer 20 may comprise a copper alloy, such as Cu—Al, Cu—Mg, Cu—Sn, Cu—In, Cu—Zr, and/or Cu—Ag. Also, the first conductive element 12 and the conductive layer 20 may each be made of different electrically-conductive metals. For example, in one embodiment, the first conductive element 12 is made of aluminum, and the conductive layer 20 is made of tungsten. The conductive via 32 will generally be made with the same conductive material that is used to make the conductive layer 20. Therefore, in the embodiment where the conductive layer 20 is made of tungsten, the conductive via 32 is typically also made of tungsten.

The electrically-conductive metal used to form the first conductive element 12 and the conductive layer 20 may be applied in one or more thin film layers by any conventional deposition technique, such as physical vapor deposition (PVD) or chemical vapor deposition (CVD). The first conductive element 12 may be any desired thickness and in some embodiments may range from about 500 nanometers to about 1000 nanometers. The conductive layer 20 may be any desired thickness, as well.

The first barrier layer 14 and the second barrier layer 18 may be formed of any of a variety of different barrier materials conventionally employed for particular interface applications. Also, the first barrier layer 14 and the second barrier layer 18 may each be made of different barrier materials. The first barrier layer 14 and the second barrier layer 18 may, for example, be formed of titanium-based barrier materials, tungsten-based barrier materials, titanium-tungsten alloy-based barrier materials, titanium nitride-based barrier materials, tungsten nitride-based barrier materials, and any desired combination of these. In one embodiment, the first barrier layer 14 and the second barrier layer 18 are each formed of titanium nitride (TiN).

In embodiments where the first conductive element 12 comprises copper, the first barrier layer 14 may comprise Ta, TaN, W, WN, Ti, TiN, or any of these in any combination to better shield the copper. Likewise, in embodiments where the conductive layer 20 comprises copper, the second barrier layer 18 may comprise Ta, TaN, W, WN, Ti, TiN, or any of these in any combination to better shield the copper.

One purpose (application) of the first barrier layer 14 is to prevent deleterious chemical reactions between (a) the conductive material employed in the first conductive element 12 and (b) the material used to form the insulating layer 16, and another purpose (application) of the first barrier layer 14 is to prevent deleterious chemical reactions between (c) the conductive material employed in the first conductive element 12 and (d) the material used to form the dielectric layer 42. Likewise, one purpose (application) of the second barrier layer 18 is to prevent deleterious chemical reactions between (e) the conductive material employed in the conductive layer 20 (and in the via 32) and (f) the material used to form the insulating layer 16.

The material used to form the first barrier layer 14 and the second barrier layer 18 may be applied in one or more thin film layers by any conventional deposition technique, such as physical vapor deposition (PVD) or chemical vapor deposition (CVD). The first barrier layer 14 and the second barrier layer 18 may be any desired thickness and in some embodiments may range from about 100 angstroms to about 15000 angstroms.

The insulating layer 16 may be formed of any of a variety of different insulating materials conventionally employed for electrically insulating applications in microelectronics. For example, the insulating layer 16 may be formed of various electrically-insulating oxides or nitrides, such as saline oxide, tetraethoxysilane (TEOS), silicon dioxide, silicon nitride, silicon oxynitride, barium strontium titanate (BST), or other known insulators, such as fluorinated silicate glass (FSG), a low dielectric constant material, or a porous low dielectric constant material having a dielectric constant k of 3.6 or less, for example.

The dielectric layer 42 may be formed of any of a variety of different dielectric materials conventionally employed for dielectric applications in microelectronics. For example, the dielectric layer 42 may be formed of silane, silicon, saline oxide, silicon dioxide, silicon nitride, silicon oxynitride, tantalum pentoxide, barium strontium titanate (BST), or various high k materials, such as $Al_2O_3$, $Ta_2O_5$, or BSTO, as examples. In one embodiment, the dielectric layer 42 is made of silicon nitride.

The material used to form the dielectric layer 42 may be deposited in any conventional manner using, for example, a chemical vapor deposition (CVD) method (such as atomic-layer CVD), a plasma-enhanced chemical vapor deposition (PECVD) method, or a physical vapor deposition (PVD) sputtering method. The dielectric layer 42 should be conformal and uniform in thickness and may have any appropriate thickness suitable for MIM capacitor formation. In some embodiments, the thickness of the dielectric layer 42 ranges from about 10 nm to about 200 nm.

Various benefits derive from practicing the present invention when creating MIM capacitors. For example, the step of removing the dielectric layer 42 from exterior surfaces 44 of the insulating layer 16 located outside of the pockets 36 (compare the intermediate 160 of FIG. 1F to the intermediate 150 of FIG. 1E) eliminates a number of steps previously employed when processing the intermediate 150 so the different pockets 36 (and the different capacitors upon filling the pockets 36 with conductive metal) are functionally and electrically insulated from each other. Processing in accordance with the prior art would typically entail etching the intermediate 150 to separate the dielectric layer 42 between the different pockets 36 to electrically isolate the different pockets 36.

Such etching would typically require, for example, (1) preparation of a resist mask, (2) measurements to determine and mark resist mask placement for proper dielectric layer 42 separation between the different pockets 36, (3) etching of the dielectric layer 42 at the marked locations to effect separation of the dielectric layer 42 between the different pockets 36, (4) measurements to determine and mark resist mask placement for proper removal of the dielectric layer 42 from atop the via(s) 32, (5) etching of the dielectric layer 42 at the marked locations to effect removal of the dielectric layer 42 from atop the via(s) 32, (6) resist stripping following completion of etching, (7) wet cleanup following resist stripping, and (8) measurement to confirm proper dielectric layer 42 separation between the different pockets 36.

Processing in accordance with the present invention to fully remove the dielectric layer 42 from surfaces of the insulating layer 16 located outside of the pockets 36, fully remove the dielectric layer 42 from the outer surface 34 of the via(s) 32, and transform the intermediate 150 into the intermediate 160 eliminates each of these steps in favor of the more efficient chemical mechanical polishing step. Use of the chemical mechanical polishing step in accordance with the present invention eliminates the measurements; eliminates resist mask preparation, placement, and stripping; and eliminates the need to etch. The chemical mechanical polishing step practiced in accordance with the present invention is quicker, easier, and less expensive than the prior art etching process and includes fewer process steps, which translates to faster, less expensive production of MIM capacitors and increased throughput of completed MIM capacitors with fewer potential defects.

The intermediates 110, 120, 130, 140, 150, 160, 210, 220, 230, 240, 250 may alternatively be referred to herein as semiconductor wafers 110, 120, 130, 140, 150, 160, 210, 220, 230, 240, 250 or as work pieces 110, 120, 130, 140, 150, 160, 210, 220, 230, 240, 250. If desired, any of the intermediates 110, 120, 130, 140, 150, 160, 210, 220, 230, 240, 250 may further comprise an additional semiconductor constituent (not shown), typically as a substrate, where portions of the insulating layer 16 will typically rest against, and be adhered to, the additional semiconductor constituent in conventional fashion. When the additional semiconductor constituent serves as a substrate, the additional semiconductor constituent may often be made of single-crystal silicon, but may permissibly instead or additionally comprise one or more compound semiconductor materials such as GaAs, InP, Si/Ge, SiC, or any of these in any combination.

Any of the intermediates 110, 120, 130, 140, 150, 160, 210, 220, 230, 240, 250 or any derivative of either the intermediate 160 or the intermediate 250, whether or not comprising the additional semiconductor constituent (typically as the substrate), may include other conductive layers (not shown), other active components or circuits (not shown), or other semiconductor elements (not shown), such as transistors or diodes, for example. Also, any of the intermediates 110, 120, 130, 140, 150, 160, 210, 220, 230, 240, 250 or any derivative of either the intermediate 160 or the intermediate 250, whether or not comprising the additional semiconductor constituent (typically as the substrate), may include field oxide, active component regions (not shown) and/or shallow trench isolation or deep trench isolation regions (not shown).

Further benefits are derived from practicing the present invention when the barrier layer 18 is left on the insulating layer 16 prior to forming the pockets 36 (see the intermediate 230 of FIG. 2C) versus removing the barrier layer 18 prior to forming the pockets 36 (see the intermediate 120 of FIG. 1B and the intermediate 140 of FIG. 1D). This change eliminates the chemical mechanical polishing step employed when going from the intermediate 120 of FIG. 1B to the intermediate 130 of FIG. 1C and no additional step is added to replace the eliminated chemical mechanical polishing step. Instead, the existing chemical mechanical polishing step employed to remove the dielectric layer 42 from portions of the insulating layer 16 located outside of the pockets 36 is further employed to simultaneously also remove the barrier layer 18 from portions of the insulating layer 16 located outside of the pockets 36. Thus, practicing this further embodiment of the present invention further simplifies creation of MIM capacitors.

Although various embodiments have been illustrated and described herein, it will be appreciated by those of ordinary skill in the art that a variety of alternate and/or equivalent implementations may be substituted for the specific embodiments illustrated and/or described herein without departing from the scope of the present invention. It should also be noted there are many alternative ways of implementing the methods and compositions of the present invention. This application is intended to cover any adaptations, alternatives, or variations of the embodiments illustrated and described herein. Therefore, it is intended that the following appended claims be interpreted as including all such alterations, permutations, and equivalents as fall within the true spirit and scope of the present invention.

What is claimed is:

1. A method of producing a capacitor, the method comprising:
    producing a first electrode having a first surface;
    forming a recess in an element, walls of the element and the first surface of the first electrode defining the recess, the element having a first surface exterior of the recess;
    forming a dielectric layer on the element, the dielectric layer oriented against the first surface of the element, against the walls of the element within the recess, and against the first surface of the first electrode;
    polishing off at least a portion of the dielectric layer oriented against the first surface of the element to electrically isolate the portion of the dielectric layer located in the recess from any portion of the dielectric layer remaining outside the recess; and
    producing a second electrode, the second electrode oriented at least partially within the recess, with the dielectric layer oriented between the first electrode and the second electrode.

2. The method of claim 1 wherein polishing comprises chemical mechanical planarizing.

3. The method of claim 2 wherein chemical mechanical planarizing comprises oxide chemical mechanical planarizing.

4. The method of claim 1 wherein polishing off comprises planarizing the portion of the dielectric layer oriented against the first surface of the element and exposing the element underlying the portion of the dielectric layer that is polished off.

5. The method of claim 1 wherein polishing off at least a portion of the dielectric layer oriented against the first surface of the element comprises removing at least the portion of the dielectric layer oriented against the first surface of the element so the portion of the dielectric layer located in the recess is electrically isolated from any portion of the dielectric layer remaining outside the recess.

6. The method of claim 1 wherein the polishing off step is the only process employed to remove any of the dielectric layer oriented against the first surface of the element.

7. The method of claim 1 wherein polishing off at least a portion of the dielectric layer oriented against the first surface of the element comprises polishing off the portion of the dielectric layer oriented against the first surface of the element without exposing the dielectric layer to any of the group consisting of a photoresist mask, an exposure mask, a vaporous etchant, a liquid etchant, an etching bath, or an optical etchant.

8. The method of claim 1 wherein the element comprises insulating material.

9. The method of claim 1 wherein the first electrode comprises a first conductive material and a barrier material, the barrier material forming the first surface of the first electrode.

10. The method of claim 9 wherein the barrier material is in contact with, and located between, the first conductive material and the dielectric layer.

11. A method of producing a capacitor, the method comprising:
    producing a first electrode having a first surface;
    forming a liner on an element, the liner oriented against a first surface of the element;
    forming a recess in the element while removing at least a portion of the liner, walls of the element and the first surface of the first electrode defining the recess, the element having a first surface exterior of the recess;
    forming a dielectric layer on the liner and in the recess, the dielectric layer oriented against the walls of the element within the recess and against the first surface of the electrode;
    polishing off at least a portion of the dielectric layer oriented against the liner to electrically isolate the portion of the dielectric layer located in the recess from any portion of the dielectric layer remaining outside the recess; and
    producing a second electrode, the second electrode oriented at least partially within the recess with the dielectric layer oriented between the first electrode and the second electrode.

12. The method of claim 11 wherein the liner comprises conductive material, the method further comprising polishing off at least a portion of the dielectric layer oriented against the liner and at least a portion of the liner oriented against the first surface of the element to electrically isolate the portion of the dielectric layer located in the recess from any portion of the dielectric layer remaining outside the recess and from any portion of the liner remaining outside the recess.

13. The method of claim 11 wherein polishing comprises polishing comprises chemical mechanical planarizing.

14. The method of claim 13 wherein chemical mechanical planarizing comprises oxide chemical mechanical planarizing.

15. The method of claim 11 wherein polishing off comprises planarizing any portion of the liner underlying the portion of the dielectric layer and exposing the element underlying the portion of the dielectric layer and the portion of the liner that are polished off.

16. The method of claim 11 wherein the polishing off step is the only process employed to remove any of the dielectric layer oriented against the liner and is the only process employed to remove any of the liner.

17. The method of claim 11 wherein polishing off at least a portion of the dielectric layer oriented against the liner comprises polishing off the portion of the dielectric layer oriented against the liner without exposing the dielectric layer or the liner to any of the group consisting of a photoresist mask, an exposure mask, a vaporous etchant, a liquid etchant, an etching bath, or an optical etchant.

18. The method of claim 11 wherein the element comprises insulating material.

19. The method of claim 11 wherein the first electrode comprises a first conductive material and a barrier material, the barrier material forming the first surface of the first electrode.

20. The method of claim 19 wherein the barrier material is in contact with and located between the first conductive material and the dielectric layer.

21. A method of producing a capacitor, the method comprising:
    forming a first electrode having a first surface;

forming a liner on an element, the liner oriented against a first surface of the element;

forming a recess in the element while removing some of the liner, walls of the element and the first surface of the first electrode defining the recess, the element having a first surface exterior of the recess;

forming a dielectric layer on the liner and in the recess, the dielectric layer oriented against the walls of the element within the recess and against the first surface of the electrode;

simultaneously removing at least a portion of the dielectric layer oriented against the liner and at least a portion of the liner to electrically isolate any portion of the dielectric layer located in the recess from any portion of the dielectric layer remaining outside the recess; and forming a second electrode, the second electrode oriented at least partially within the recess with the dielectric layer oriented between the first electrode and the second electrode.

22. The method of claim 21 wherein the liner comprises conductive material, removal of at least a portion of the dielectric layer oriented against the liner and at least a portion of the liner effective to electrically isolate the portion of the dielectric layer located in the recess from any portion of the dielectric layer remaining outside the recess and from any portion of the liner remaining outside the recess.

* * * * *